(12) United States Patent
Lee et al.

(10) Patent No.: US 10,389,347 B2
(45) Date of Patent: Aug. 20, 2019

(54) SIGNAL BASED IGNITION WITH INDUCTIVE FLYBACK POWER

(71) Applicant: SEMICONDUCTOR COMPONENTS INDUSTRIES, LLC, Phoenix, AZ (US)

(72) Inventors: Kyoung Min Lee, Flemington, NJ (US); James Gillberg, Flemington, NJ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 97 days.

(21) Appl. No.: 15/800,893

(22) Filed: Nov. 1, 2017

(65) Prior Publication Data
US 2019/0028096 A1    Jan. 24, 2019

Related U.S. Application Data

(60) Provisional application No. 62/535,153, filed on Jul. 20, 2017.

(51) Int. Cl.
*H03K 17/0812* (2006.01)
*F02P 3/04* (2006.01)

(52) U.S. Cl.
CPC ...... *H03K 17/08122* (2013.01); *F02P 3/0407* (2013.01); *H03K 17/08128* (2013.01)

(58) Field of Classification Search
CPC ............ H03K 17/08122; H03K 17/08128
See application file for complete search history.

(56) References Cited

U.S. PATENT DOCUMENTS

| | | | |
|---|---|---|---|
| 6,539,929 B2 * | 4/2003 | Ito | F02P 3/053 123/630 |
| 6,814,066 B2 * | 11/2004 | Ando | F02P 11/06 123/630 |
| 9,273,626 B2 | 3/2016 | Gillberg | |
| 9,337,728 B2 | 5/2016 | Gillberg et al. | |
| 9,745,947 B2 | 8/2017 | Gillberg et al. | |
| 10,008,835 B2 * | 6/2018 | Miyazawa | H01L 27/088 |
| 2009/0161287 A1 * | 6/2009 | Kandah | H03K 5/08 361/263 |
| 2016/0265501 A1 * | 9/2016 | Miyazawa | F02P 3/0552 |
| 2019/0003441 A1 * | 1/2019 | Miura | F02P 3/0554 |

* cited by examiner

*Primary Examiner* — Patrick O Neill
(74) *Attorney, Agent, or Firm* — Brake Hughes Bellermann LLP

(57) ABSTRACT

A method includes configuring a switching control circuit to operate a power switch to apply power to an inductive device in response to a control signal. The switching control circuit includes a voltage regulator configured to generate a supply voltage from the control signal to power the switching control circuit when the control signal is at or above an operating voltage of switching control circuit. Further, the switching control circuit is configured to controllably discharge the inductive device after power has been applied to the inductive device for a maximum dwell time. The method further includes sampling a flyback voltage off the discharging inductive device, and generating, from the sampled flyback voltage, the supply voltage to power the switching control circuit when the control signal has dropped below the operating voltage of switching control circuit.

20 Claims, 5 Drawing Sheets

SIGNAL BASED IGNITION WITH INDUCTIVE FLYBACK POWER

CROSS REFERENCE TO RELATED APPLICATION

This application is a non-provisional of, and claims priority to, U.S. Provisional Application No. 62/535,153, entitled: "SIGNAL BASED IGNITION WITH INDUCTIVE FLYBACK POWER," filed on Jul. 20, 2017, which is hereby incorporated by reference in its entirety herein.

TECHNICAL FIELD

The present disclosure relates to power switching systems, and more particularly, to power switching systems with supply voltages derived from an input control signal.

BACKGROUND

Automotive ignition systems generally employ a power switching circuit that alternately makes and breaks an electrical connection from the vehicle battery, through an ignition coil to ground. The switching is typically based on a signal received from an engine control unit, which is timed to fire the engine spark plugs as needed for operation of the engine (e.g., for initiating fuel combustion cycles in the engine). The switching circuit, which may be implemented as an integrated circuit (IC), uses a supply voltage to power the circuit and its constituent components. This supply voltage is generally provided from a battery voltage of the vehicle battery and may, therefore, include high voltage transients, large voltage swings, high frequency noise and other artifacts (e.g., electrostatic discharge (ESD)) that can be detrimental to the operation and/or reliability of the switching circuit.

Additional protection circuitry can be used to protect the switching circuit IC from these voltage transients, large voltage swings, and high frequency noise as well as from electrostatic discharge (ESD). The protection circuitry, which may include large resistors and capacitors, can consume up to half of the switching circuit IC area, or more, in some cases. This typically results in increased size and cost of the switching circuit IC and may adversely impact reliability if the harsh environmental conditions imposed by the vehicle battery are not adequately filtered by the protection circuitry.

SUMMARY

In at least one general aspect, a power switching system can include a power semiconductor device (e.g., semiconductor power switch such as an Insulated Gate Bipolar Transistor (IGBT) or an Insulated Gate Metal Oxide Semiconductor Field Effect Transistor (MOSFET)) configured as a power switch for charging and discharging an ignition coil coupled to a collector of the power semiconductor device (e.g., an IGBT). The power switching system further includes a switch controller circuit which is responsive to an externally sourced control signal to switch the ignition coil through controlled charge-discharge cycles by turning the IGBT on and off. Additionally, the externally sourced control signal provides power to the switch controller circuit.

When the IGBT is turned off, an inductive current flowing through the ignition coil raises the voltage on the collector of the IGBT. This collector voltage can be sampled and used to alternatively power the switch controller circuit, for example, when the externally sourced control signal is lowered below an operating voltage of the switch controller circuit or is not available to power the switch controller circuit. The alternatively powered switch controller circuit can continue functioning (e.g., for a "maximum dwell/soft shutdown function") even after the externally sourced control signal is below the operating voltage of the switch controller circuit.

DETAILED DESCRIPTION

This disclosure relates to systems and methods for a power switching system with a switching control circuit. The disclosed power switching system may be configured to switch power (e.g., using a power semiconductor device such as an IGBT or a MOSFET as a power switch), delivered from a battery, to an inductive device (e.g., an engine ignition coil, a hot plug, and a solenoid driver, etc.) based on an input control signal provided from an engine control unit or other external source. The switching control circuit may be powered by a supply voltage (also referred to interchangeably herein as "an operating voltage"), which is derived from the input control signal. The switching control circuit may include a voltage conditioning circuit configured to generate the supply voltage from the input control signal, eliminating the need to obtain a supply voltage from the battery as well as the need to provide associated filtering and protection from battery voltage transients.

In some applications, the power switching circuit may be configured to switch power to an ignition coil or other vehicle components (e.g., a hot plug, a solenoid driver, etc.) and the input control signal (e.g., a spark timing signal) may be provided by an engine control unit (ECU). The input control signal may be used to cycle the ignition coil through controlled charge-discharge cycles. In each cycle, power may be applied to the ignition coil to charge the ignition coil during a charging period, followed by a discharging period in which no power is applied to the ignition coil. In each cycle, the charging period is limited to be no greater than a pre-defined time limit ("maximum dwell time") before the discharging period begins.

A desirable function of the switching control circuit for such applications is a soft shutdown function that may be activated after a maximum dwell time (of charging an ignition coil when the control signal is high) to avoid ignition coil failure or uncontrolled firing of a spark (e.g., in a spark plug coupled to the ignition coil). When the soft shutdown function is activated, the ignition coil may be controllably discharged (to avoid sparking) in a soft shutdown phase or cycle by gradually (e.g., linearly lowering) the gate voltage of the IGBT toward zero. If the control signal that powers the switching control circuit drops below the operating voltage of the switching control circuit during the soft shut down cycle, leaving the ignition coil in an undischarged state, the ignition coil may still undesirably fire a spark. This disclosure describes systems and methods for enabling maximum dwell time/soft shut down functions of a signal-based ignition system even when the control signal that powers the switching control circuit drops below the operating voltage of the switching control circuit.

Figure 1A:
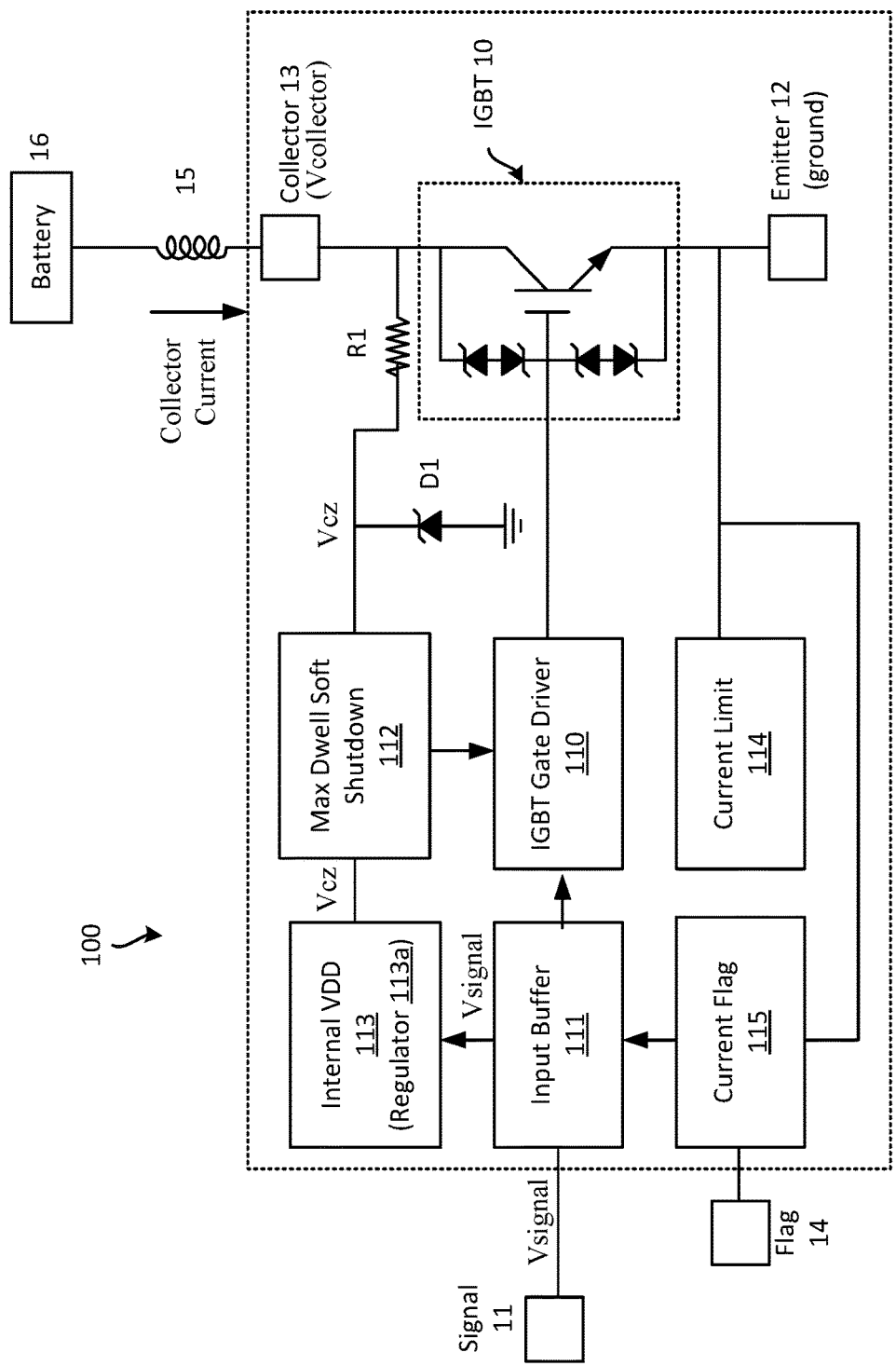
FIGS. 1A and 1B are diagrams that illustrate a switch controller circuit, consistent with the present disclosure.

FIG. 1A illustrates a switching control circuit 100 consistent with the present disclosure. An ignition coil 15 to be charged or discharged is electrically coupled between a battery 16 and a collector (e.g., collector 13) of a power switch (e.g., IGBT 10) and through the power switch to ground. IGBT 10 is configured to selectively couple ignition coil 15 between a battery voltage (e.g., battery 16) and ground (e.g., emitter 12) under the control of switching control circuit 100. Switching control circuit 100 includes an input buffer 111 configured to receive a switch control signal (e.g., signal 11, which may be a spark timing signal) that is provided to switching control circuit 100 from an external source (e.g., an engine control unit (ECU) 20). In response to signal 11, a gate driver circuit (e.g., IGBT gate driver 110) in switching control circuit 100 generates a gate drive signal that opens and closes IGBT 10 (i.e., turns IGBT 10 on and off). IGBT gate driver 110 and other components of switching control circuit 100 are powered from a supply voltage (e.g., internal VDD 113) that may be derived from signal 11 rather than from battery 16. When signal 11 changes to a high value (e.g., goes high), IGBT 10 opens to charge ignition coil 15. When signal 11 changes to a low value (e.g., goes low), IGBT 10 closes to stop further charging of ignition coil 15. Collector 13 of the IGBT 10 may rise to a high voltage (e.g., 400 volts) and fire a spark through a secondary winding of the coil (not shown).

A switching control circuit 100 may include a current sense circuit (e.g., current limit 114 and current flag 115), which may measure the current flowing through ignition coil 15 (as measured at the emitter ground of IGBT 10). Current flag 115 may generate a flag signal (e.g., flag 14) indicating when the current flowing through ignition coil 15 is at a certain level (e.g., 6-8 amperes). Flag 14 may be used (e.g., by engine control unit (ECU) 20) to monitor, control, or shape signal 11 (e.g., a spark timing signal) for charging/discharging operations of ignition coil 15.

When the signal (e.g., signal 11) initially goes high, a timer (not shown) may start a dwell time measurement determining how long the ignition coil is being charged (by signal 11 remaining high). In some implementations, the timer may be a component or function of maximum dwell soft shutdown 112 in switching control circuit 100.

To avoid unlimited charging of the coil and uncontrolled sparking, maximum dwell soft shutdown 112 in switching control circuit 100 may, when a maximum dwell time is exceeded, initiate a soft shutdown cycle. The soft shutdown cycle may slowly discharge ignition coil 15 by gradually turning the gate voltage of IGBT 10 downward.

Figure 2:
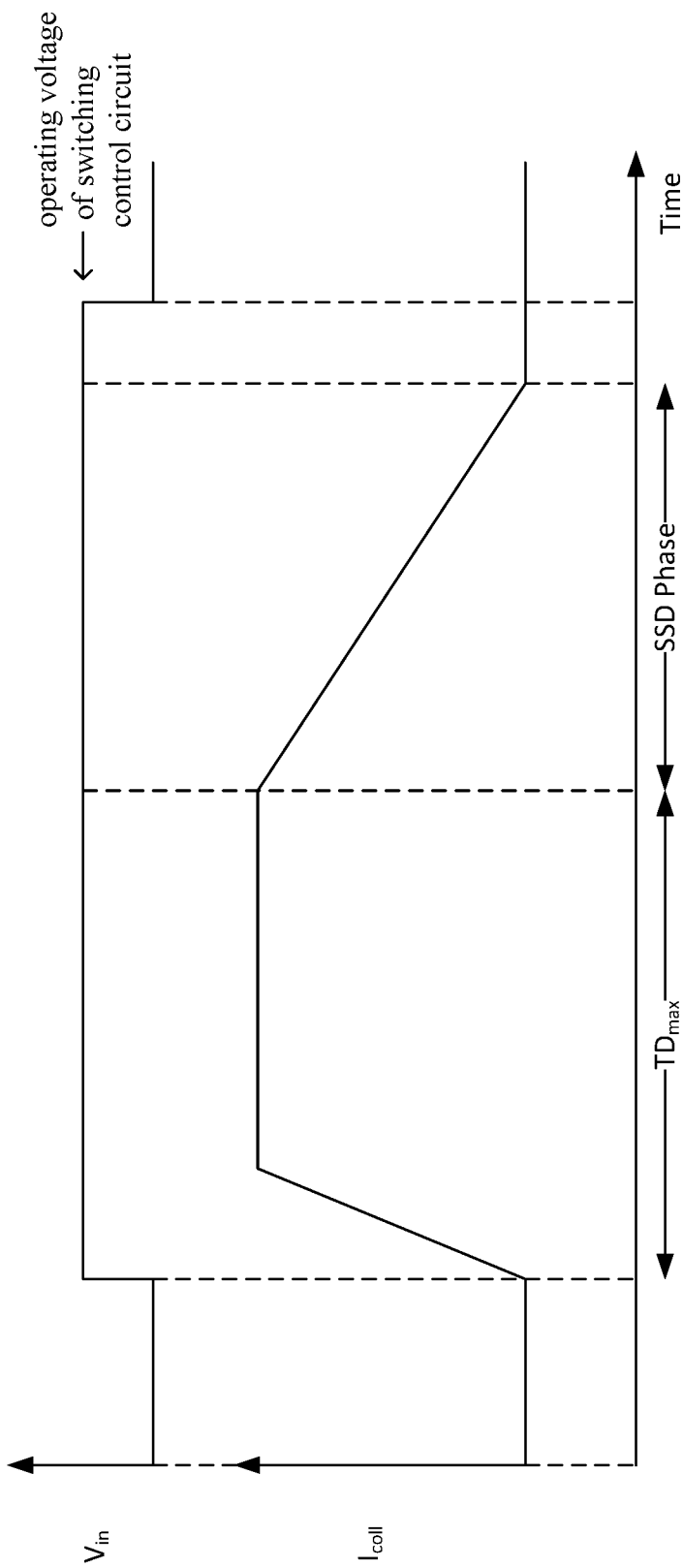
FIG. 2 is an illustration of example control signal voltage and current waveforms in a switch controller circuit leading up to a maximum dwell time and through a subsequent soft shutdown cycle.

FIG. 2 shows example control signal voltage and collector current waveforms in switching control circuit 100 leading up to a maximum dwell time ("$TD_{max}$") and through a subsequent soft shutdown cycle ("SSD Phase"). FIG. 2 shows, for example, an input control signal voltage ($V_{in}$) that is locked and has not dropped (i.e., below the operating voltage of switching control circuit 100) within the maximum dwell time ($TD_{max}$), and IGBT collector current ($L_{coil}$) while the inductive device is charging in the period up to $TD_{max}$ and through the subsequent soft shut down cycle (SSD Phase). Since (as shown in FIG. 2) the control signal voltage is at or above the operating voltage of switching control circuit 100 during the SSD phase, power to operate switching control circuit 100 can be derived from the control signal voltage itself during the SSD phase.

Referring back to FIGS. 1A and 1B, like the other components in switching control circuit 100, maximum dwell soft shutdown 112 may be powered by the supply voltage (e.g., internal VDD 113) derived from a high signal 11 that is at or above the operating voltage (e.g., VDD 113) of switching control circuit 100. Switching control circuit 100 including maximum dwell soft shut down 112 loses power when signal 11 drops to a low value that is below the operating voltage of the switching control circuit. This loss of power to operate switching control circuit 100 is remedied in the implementations of switching control circuit 100 described herein (e.g., with reference to FIG. 1B).

In implementations of switching control circuit 100 consistent with the present disclosure, maximum dwell soft shutdown 112 may be, additionally or alternatively, powered by a voltage (e.g., internal VDD 113) derived from the collector 13. If signal 11 drops to a low value during the soft shutdown, flyback energy (or flyback voltage) sampled off the collector can be used to keep the gate of IGBT 10 active and powered until ignition coil 15 can be discharged and any spark produced by the discharge has been avoided.

Since ignition coil 15 has inductive energy stored in it while IGBT 10 is on, ignition coil 15 continues to flow current to drain the stored inductive energy even when IGBT 10 is turned off causing the IGBT collector-to-emitter voltage (e.g., Vcollector) to rise when IGBT gate starts to shut-down and limits coil current. The rising (e.g., Vcollector) may be referred to herein as the flyback voltage.

When the soft shutdown cycle is initiated by turning off IGBT 10 to discharge ignition coil 15, collector 13 can go to a high value (e.g., 40-100 V) without triggering sparking of the ignition coil. This collector voltage (e.g., Vcollector) on collector 13 can be sampled as an alternate supply voltage (internal VDD 113) to power components of switching control circuit 100, for example, in instances where signal 11 fails or drops to a low value during a soft shutdown cycle. Vcollector may be used to power maximum dwell soft shutdown 112 through completion of the soft shutdown cycle even when signal 11 is not available or insufficient for power (i.e., signal 11 is below the operating voltage of switching control circuit 100).

In normal sparking operation of the ignition coil, a current limiting resistor (e.g. resistor R1) and a clamping diode (e.g., diode D1) can be used to protect switching control circuit 100 from high collector voltages (e.g., 400V) during sparking.

In example implementations, sampling circuit 30 may be used to provide a feedback path to sample Vcollector during the soft shutdown cycle. An example sampling circuit 30 may include a current limiting resistor (e.g. resistor R1) and a clamping diode (e.g., diode D1). Vcollector, which may be a few tens of volts (e.g., 40-100 volts), may be reduced by R1 and D1 to a lower voltage (e.g., a clamping voltage of diode D1) to power switching control circuit 100.

In some implementations, sampling circuit 30 (including resistor R1 and/or diode D1) may be embodied as an integrated circuit (IC) capable of handling the high collector voltages of the collector 13. In some implementations, one or more components (e.g., resistor R1 and/or diode D1) of sampling circuit 30 may be included in the IGBT 10. In some implementations, one or more components (e.g., resistor R1 and/or diode D1) of sampling circuit 30 may be included as circuit elements of switching control circuit 100.

In some implementations, for example, the resistor R1 can be included in the IGBT 10 and the D1 can be an external component (e.g., outside of the IGBT 10 or an IC), or an element included in an IC. In some implementations, one or more components (e.g., resistor R1 and/or diode D1) of sampling circuit 30 may be external to the IGBT 10 and not included in the IC.

In normal operation, with signal 11 present (above the operating voltage of switching control circuit 100), an internal regulator circuit (e.g., voltage regulator 113a, which may be a voltage clamp) uses signal 11 voltage (Vsignal) to generate the internal voltage source (e.g., internal VDD) to power all the circuit blocks of switching control circuit 100.

Figure 1B:
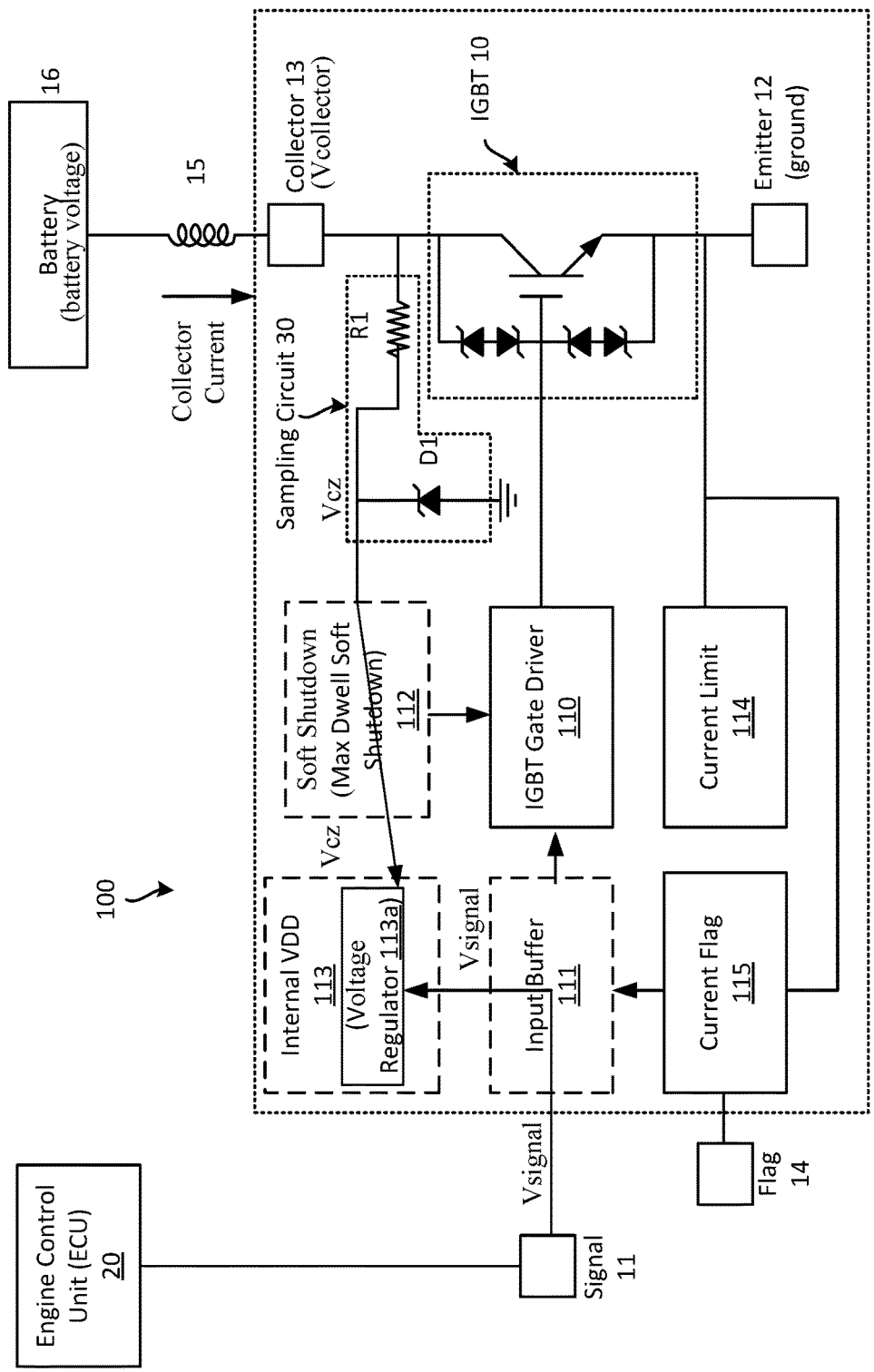

The internal regulator circuit (e.g., voltage regulator 113a) may also be configured to alternatively (or in combination) take the sampled collector voltage $V_{CZ}$ (i.e., the voltage clamped by the Zener diode D1) as input and regulate the input voltage to provide the power to all other circuit blocks within switching control circuit 100. Thus, Vsignal and/or VCZ can be used to power switching control circuit 100. These various configurations are shown in FIG. 1B.

Functions of switching control circuit 100 (e.g., maximum dwell soft shutdown, or other functions) are enabled even when Vsignal is not available or insufficient to power switching control circuit 100 by instead using $V_{CZ}$ to power switching control circuit 100.

FIG. 3 shows current and voltages at different components in a switching control circuit in an example scenario, consistent with the present disclosure. Specifically, in the example scenario of FIG. 3, an external control signal that powers the switching control circuit is lost during a soft shutdown process, and the power supply is transitioned from external control signal 11 to a sampled collector voltage $V_{CZ}$ in the switching control circuit 100.

FIGS. 3A-3F show, for example, current and voltages at different components (e.g., at IGBT 10 collector, input buffer 111, IGBT gate, Diode D1, and Internal VDD 113) in switching control circuit 100 in an example scenario in which Vsignal is suddenly lost (e.g., changes from logic high to logic low) at time T1 during a soft shutdown process, and power supply for internal VDD 113 is transitioned at time T2 from Vsignal to the sampled collector voltage Vcz in switching control circuit 100, consistent with the present disclosure.

Figure 3A:
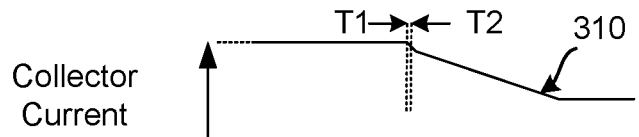
FIGS. 3A-3F show current and voltages at different components in a switch controller circuit in an example scenario, consistent with the present disclosure.
Figure 3B:
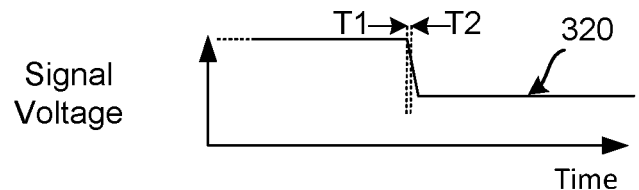
Figure 3C:
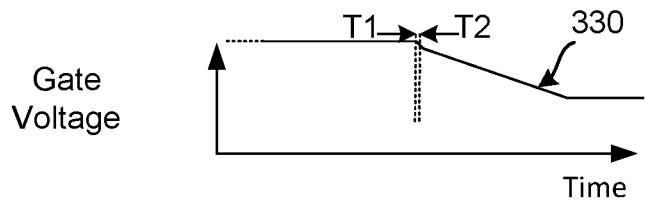
Figure 3D:
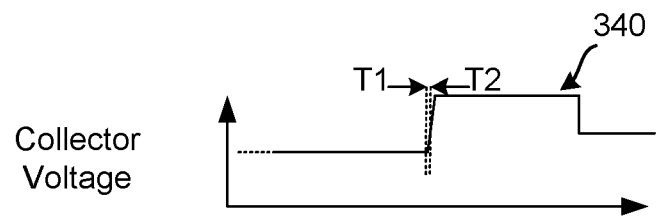
Figure 3E:
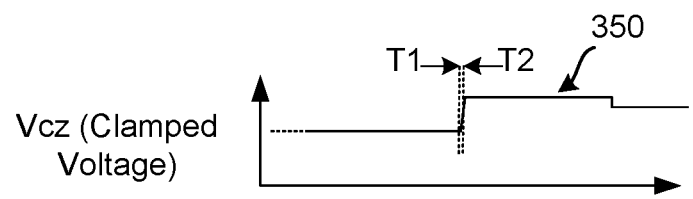
Figure 3F:
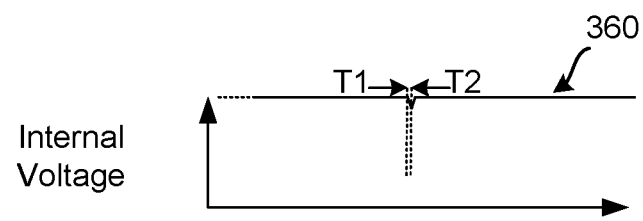

As shown in FIG. 3B, Vsignal (SIGNAL VOLTAGE 320) received at input buffer 111 is high before time T1. As shown in FIG. 3F, this results in a positive regulated INTERNAL VOLTAGE 360 (e.g., at internal VDD 113) to power, for example, IGBT gate driver 110. As shown in FIG. 3C, IGBT gate driver 110 may apply a GATE VOLTAGE 330 to the gate of IGBT 10 resulting in a correspondingly high collector current (COLLECTOR CURRENT 310) (shown in FIG. 3A) and a low collector voltage (COLLECTOR VOLTAGE 340) (shown in FIG. 3D) at collector 13 of IGBT 10. The low collector voltage (COLLECTOR VOLTAGE 340) at the collector 13 of IGBT may result in a correspondingly low Vcz (CLAMPED VOLTAGE) 350 (shown in FIG. 3E) at diode D1.

At time T1, when Vsignal is lost, regulated INTERNAL VOLTAGE 360 (e.g., at internal VDD 113) also drops. This drop causes loss of power in switching control circuit 100 and causes the gate voltage (GATE VOLTAGE 330) applied to the gate of IGBT 10 to decrease. The decrease in gate voltage (GATE VOLTAGE 330) causes IGBT 10 to act as a bottleneck for continuous flow of the induced current (i.e. COLLECTOR CURRENT 310), which causes the collector voltage (COLLECTOR VOLTAGE 340) at the collector 13 of IGBT 10 to rise (at T2) suddenly since the inductive energy of ignition coil 15 pushes the ignition coil current continuously.

The increase in the collector voltage (COLLECTOR VOLTAGE 340) is distributed across resistor R1 to limit the current and then is clamped by diode D1 to a voltage (Vcz (Clamped Voltage) 350) that can be received into switching control circuit 100 (e.g., at voltage regulator 113a). Voltage regulator 113a may regulate voltage (Vcz (Clamped Voltage) 350)) to generate the internal source voltage INTERNAL VOLTAGE 360 (e.g., at internal VDD 113) to provide power to switching control circuit 100.

As shown in FIG. 3A, switching control circuit 100 continues to operate after time T2 to gradually reduce the gate voltage (GATE VOLTAGE 330) to advance the soft shutdown process to conclusion.

Thus, even when Vsignal becomes unavailable or insufficient to power switching control circuit 100, the soft shutdown process can be executed to completion using the sampled voltage from the collector to power switching control circuit 100. Undesired sparking events that may be caused by residual inductive energy stored in an undischarged or partially discharged inductive device can be prevented by executing the soft shutdown process to completion.

In an example implementation, a power switch (e.g., a power semiconductor device such as an IGBT) may be connected in series to an inductive device between a battery and ground. The inductive device may, for example, be an ignition coil in an automobile's ignition system that transforms the battery's low voltage in charge-discharge cycles to the thousands of volts needed to create an electric spark in a spark plug igniting fuel in the automobile's combustion engine. A switching control circuit may turn the power switch on or off to apply power to the inductive device for the charge-discharge cycles in response to a control signal, which may generated, for example, by the automobile engine control unit.

Figure 4:
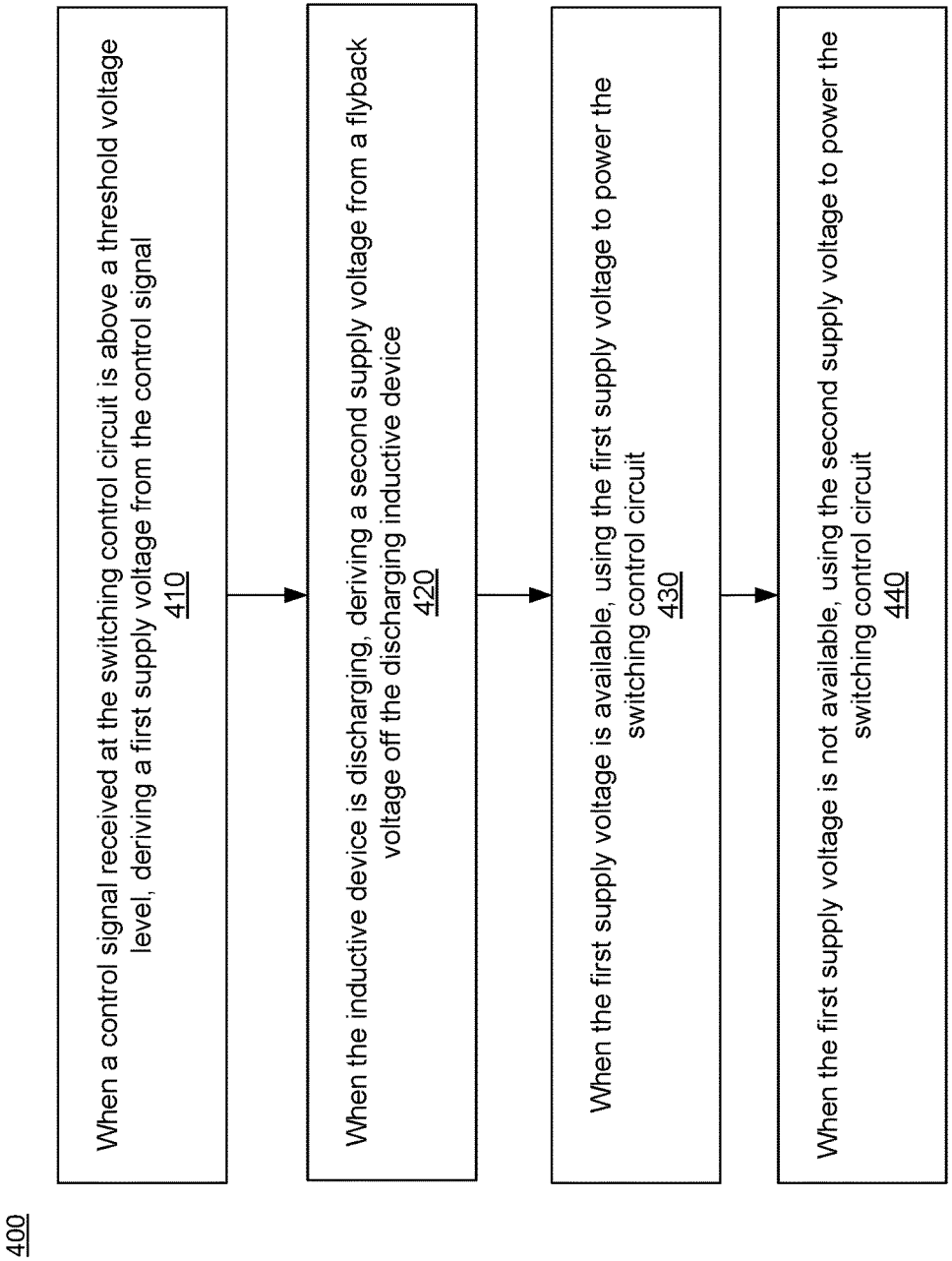
FIG. 4 is an illustration of example method for switching power to an inductive device, consistent with the present disclosure.

FIG. 4 is an illustration of example method 400 for powering a switching control circuit that turns a power switch on and off to apply power to an inductive device, consistent with the present disclosure.

Method 400 includes, when a control signal received at the switching control circuit is above a threshold voltage level, deriving a first supply voltage from the control signal (410), and, when the inductive device is discharging, deriving a second supply voltage from a flyback voltage off the discharging inductive device (420). Method 400 further includes when the first supply voltage is available, using the first supply voltage to power the switching control circuit (430), and, when the first supply voltage is not available, using the second supply voltage to power the switching control circuit (440). In method 400, the threshold voltage level may, at a minimum, correspond to the operating voltage of the switch controller circuit.

It will also be understood that when an element, such as a transistor or resistor, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application (if included) may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes an industrial motor driver, a solar inverter, ballast, a general-purpose half-bridge topology, an auxiliary and/or traction motor inverter driver, a switching mode power supply, an on-board charger, an uninterruptible power supply (UPS), a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A system comprising:
   a switching control circuit configured to operate a power switch applying power to an inductive device in response to a control signal,
   the switching control circuit including a voltage regulator and a soft shutdown module,
   the voltage regulator configured to generate a supply voltage from the control signal to power the switching control circuit when the control signal is at or above an operating voltage of switching control circuit,
   the soft shutdown module configured to controllably discharge the inductive device after power has been applied to the inductive device for a maximum dwell time; and
   a sampling circuit configured to sample a flyback voltage off the discharging inductive device and supply the sampled flyback voltage to the voltage regulator to generate the supply voltage to power the switching control circuit when the control signal drops below the operating voltage of switching control circuit.

2. The system of claim 1, wherein the power switch is a power semiconductor device, and wherein the switching control circuit includes a gate driver circuit configured to apply a gate drive signal to a gate of the power semiconductor device to switch the power semiconductor device on and off based on the control signal.

3. The system of claim 1, wherein the power switch is an insulated gate bipolar transistor.

4. The system of claim 1, wherein the power switch is an insulated gate metal oxide semiconductor field effect transistor.

5. The system of claim 1, wherein the sampling circuit includes a current limiting resistor and a clamping diode.

6. The system of claim 5, wherein the sampling circuit samples a voltage at a collector of the power switch.

7. The system of claim 1, wherein said control circuit further includes:
   a current sense circuit configured to measure current flowing through the inductive device and the power switch to ground.

8. The system of claim 7, wherein the current sense circuit generates a flag signal indicating an amount of current flowing through the inductive device to a ground.

9. The system of claim 1, wherein the power switch is configured to electrically couple the inductive device between a battery voltage and a ground.

10. The system of claim 1, wherein the inductive device is selected from the group consisting of an engine ignition coil, a hot plug and a solenoid driver.

11. A system comprising:
    an ignition coil having a first terminal coupled to a battery and a second terminal coupled to a ground via a power switch;
    a switching control circuit configured to turn the power switch on to charge the ignition coil, and to close the power switch to discharge the ignition coil, the ignition coil generating an inductive flyback voltage at the second terminal when discharging; and
    a sampling circuit coupled to a voltage regulator,
    the sampling circuit configured to sample the inductive flyback voltage at the second terminal, and the voltage regulator configured to generate a supply voltage to power the switching control circuit from the sampled inductive flyback voltage.

12. The system of claim 11, wherein the power switch is an insulated gate bipolar transistor.

13. A method comprising:
    configuring a switching control circuit to operate a power switch to apply power to an inductive device in response to a control signal,
    the switching control circuit including a voltage regulator configured to generate a supply voltage from the control signal to power the switching control circuit when the control signal is at or above an operating voltage of switching control circuit, the switching control circuit configured to controllably discharge the inductive device after power has been applied to the inductive device for a maximum dwell time;

sampling a flyback voltage off the discharging inductive device; and generating, from the sampled flyback voltage, the supply voltage to power the switching control circuit when the control signal has dropped below the operating voltage of switching control circuit.

14. The method of claim 13, wherein the power switch is a power semiconductor device, the method further comprising applying a gate drive signal to a gate of the power semiconductor device to switch the power semiconductor device on and off based on the control signal.

15. The method of claim 13, wherein the power switch is an insulated gate metal oxide semiconductor field effect transistor.

16. The method of claim 13, wherein a sampling circuit used for the sampling the flyback voltage includes a current limiting resistor and a clamping diode.

17. The method of claim 13, wherein the sampling a flyback voltage off the discharging inductive device includes sampling a voltage at a collector of the power switch.

18. The method of claim 13, further comprising configuring the power switch to electrically couple the inductive device between a battery voltage and a ground.

19. The method of claim 13, further comprising measuring current flowing through the inductive device and the power switch to ground.

20. The method of claim 19, further comprising generating a flag signal indicating an amount of current flowing through the inductive device to a ground, and using the flag signal to shape the control signal.

* * * * *